United States Patent

Fukuzawa et al.

Patent Number: 6,111,722
Date of Patent: Aug. 29, 2000

[54] MAGNETORESISTANCE EFFECT ELEMENT HAVING IMPROVED BIASING FILMS, AND MAGNETIC HEAD AND MAGNETIC RECORDING DEVICE USING THE SAME

[75] Inventors: Hideaki Fukuzawa, Sagamihara; Yuzo Kamiguchi, Yokohama; Hitoshi Iwasaki, Yokosuka; Yuichi Ohsawa, Tokyo, all of Japan

[73] Assignee: Kabushiki Kaisha Toshiba, Kawasaki, Japan

[21] Appl. No.: 09/071,040

[22] Filed: May 4, 1998

[30] Foreign Application Priority Data

May 7, 1997 [JP] Japan ................................. 9-117237

[51] Int. Cl.$^7$ ..................................................... G11B 5/39
[52] U.S. Cl. ............................................................ 360/113
[58] Field of Search ............................ 360/113; 324/252; 338/32 R

[56] References Cited

U.S. PATENT DOCUMENTS

| | | | |
|---|---|---|---|
| 5,434,826 | 7/1995 | Ravipati et al. | 360/113 |
| 5,654,854 | 8/1997 | Mallary | 360/113 |
| 5,742,162 | 4/1998 | Nepela et al. | 324/252 |
| 5,748,416 | 5/1998 | Tobise et al. | 360/113 |
| 5,867,351 | 2/1999 | Gill | 360/113 |
| 5,876,843 | 3/1999 | Ishiwata | 428/209 |
| 5,896,251 | 4/1999 | Ohsawa et al. | 360/113 |
| 5,923,503 | 7/1999 | Sato et al. | 360/113 |
| 5,936,810 | 8/1999 | Nakamoto et al. | 360/113 |

FOREIGN PATENT DOCUMENTS

| | | |
|---|---|---|
| 0 768 643 | 4/1997 | European Pat. Off. . |
| 7-182629 | 7/1995 | Japan . |
| 9-97409 | 4/1997 | Japan . |

OTHER PUBLICATIONS

"Dual–Element GMR/Inductive Heads for Gigabits Density Recording Using CoFe Spin–Valves", by Yoda, et al., IEEE on Magnetics, vol. 32, No. 5, Sep., 1996, pp. 3363–3367.
Tadokoro et al., Magnetic Properties of FeCr/CoCrPt Hard Magnetic Films, Digests of the 20$^{th}$ Annual Conference on Magnetics in Japan, 23PA–2 (Sep. 20, 1996).
Zhu et al., Impact of Microstructure on Stability of Permanent Magnet Biased Magnetoresistive Heads, IEEE Transactions on Magnetics, vol. 32, No. 1, pp. 54–60 (Jan. 1996).
Patent Abstracts of Japan, JP 4–245011, published Sep. 1, 1992.

*Primary Examiner*—Jefferson Evans
*Attorney, Agent, or Firm*—Finnegan, Henderson, Farabow, Garrett & Dunner, L.L.P.

[57] ABSTRACT

A spin valve GMR element comprises a pair of magnetic biasing films disposed with a predetermined gap and a spin valve GMR film disposed in such a manner that at least both edge portions thereof are stacked on the pair of magnetic biasing films. The spin valve GMR film has a free layer containing a magnetic layer large in its saturation magnetization such as a Co containing magnetic layer. The magnetic biasing film has a laminate film composed of a high saturation magnetization magnetic layer and a magnetic hard layer. The high saturation magnetization layer, for a saturation magnetization $Ms^{free}$ of a free layer and a saturation magnetization of $Ms^{hard}$ of a magnetic hard layer, has a saturation magnetization $Ms^{high}$ satisfying at least one of $Ms^{high} \geq Ms^{free}$ and $Ms^{high} \geq Ms^{hard}$. According to such a bias structure, when a spin valve GMR element of an over laid structure is narrowed in its track, Barkhausen noise can be effectively suppressed from occurring.

18 Claims, 12 Drawing Sheets

MAGNETORESISTANCE EFFECT ELEMENT HAVING IMPROVED BIASING FILMS, AND MAGNETIC HEAD AND MAGNETIC RECORDING DEVICE USING THE SAME

BACKGROUND OF THE INVENTION

1. Field of the Invention

The present invention relates to a magnetoresistance effect element using a magnetic multi-layer film having a giant magnetoresistance effect, and a magnetic head and a magnetic recording device using the same.

2. Description of the Related Art

In a magnetic recording device such as an HDD, in order to enhance a recording density, a tendency of narrowing a recording track width of a recording medium is in progress. To compensate for the decrease of read output due to this narrowing of the recording track width, a demand for a magnetic head (MR head) employing a highly sensitive magnetoresistance effect element(MR element) is becoming strong. In particular, an MR head which is consisting of a magnetic multi-layer film stacked on a substrate in turn of a ferromagnetic layer (hereinafter refer to as a free layer) of which magnetization rotates according to a signal magnetic field, a non-magnetic layer, a ferromagnetic layer of which magnetization is pinning (hereinafter refer to as a pinned layer), and an antiferromagnetic layer for pinned the magnetization of the pinned layer, and displaying a giant magnetoresistance effect, is attracting attention.

In an MR head employing a spin valve film, Barkhausen noise due to discontinuous shift of magnetic domain walls of a free layer is a problem when putting it into practical use. To circumvent such a problem, a so-called overlaid structure is proposed, in which, as shown in FIG. 21, on area off a track width Wt of a spin valve film 1, a pair of magnetic hard layers 2 are disposed in advance as hard magnetic biasing films and both edge portions of the spin valve film 1 are stacked on the pair of hard magnetic layers 2.

In an overlaid structure, an exchange coupling is caused through stacking of a spin valve film 1 and magnetic hard layers 2. By extinguishing a magnetic domain of a free layer with a bias magnetic field due to mainly exchange coupling, Barkhausen noise is suppressed. An MR head of such an overlaid structure is expected because a high read output can be obtained, and an excellent off-track profile is displayed (IEEE Trans. on Mag. Vol. 32,3363(1996)).

Further, in a spin valve MR head shown in FIG. 21, a spin valve film 1 consists of a free layer 3, a non-magnetic layer 4, a pinned layer 5 and an antiferromagnetic layer 6. On the spin valve film 1, a pair of electrodes 7 for providing a sense current thereto are formed. A spin valve film 1 is interposed between a pair of magnetic shield layers 9a, 9b disposed above and below through magnetic gaps 8a, 8b, respectively. These constitute a shield type MR head. For enhancing sensitivity of a spin valve film 1, a Co containing ferromagnetic material such as a CoFe alloy is effective as a free layer 3 and a pinned layer 5.

Now, in order to respond to a further high densification of a magnetic recording density, even in a spin valve MR head, further narrowing of gaps (thinning of magnetic gaps 8a, 8b) is demanded. When an overlaid structure is applied in such a narrow gapped MR head as a bias structure, there is a problem that an effective bias strength can not be obtained. That is, even if a bias strength is tried to be heightened by increasing film thickness of magnetic hard layers 2 as a hard magnetic biasing film, since bias magnetic field leaks toward magnetic shield layers 9a, 9b, an effective bias strength can not be obtained.

In particular, when an overlaid structure is applied to a spin valve film possessing a non-magnetic under layer such as Ta, a magnetic coupling force between a free layer and a hard magnetic layer becomes weak to decrease a biasing effect of a bias magnetic field based on an exchange coupling. Thereby, a suppression effect of Barkhausen noise is further deteriorated.

As described above, in a bias structure of an MR head employing a spin valve film, an overlaid structure in which portions outside from a magnetic field detecting portion of a spin valve film are stacked on hard magnetic layers, due to the narrowing of gap or track of an MR head, is becoming difficult to supply effectively a biasing magnetic field to a free layer. Further, a spin valve film is under study to use as a magnetic memory device such as a magnetoresistance effect memory (MRAM). As to an MRAM, though there is not found so much mentioning of a structure with a biasing film, in some cases, a biasing film may become necessary. In such a case, a technology for eliminating noise with stability even when a size of a unit-cell is decreased is demanded.

SUMMARY OF THE INVENTION

Therefore, an object of the present invention is to provide a magnetoresistance effect element enabling to suppress effectively occurrence of Barkhausen noise resulting from, for instance, the narrowing of a track by materializing effective input of a biasing magnetic field to a spin valve film in which an overlaid structure is applied. The other object of the present invention, by employing the above described magnetoresistance effect element, in addition to attempt to respond to higher densification of a recording density, is to provide a magnetic head and a magnetic recording device of which performance is improved.

A magnetoresistance effect element of the present invention comprises a pair of magnetic biasing films which have laminate films comprising of a hard magnetic layer and a high saturation magnetization magnetic layer, a magnetoresistance effect film having a free layer varying its magnetization direction according to an external magnetic field, a non-magnetic layer stacked on the free layer thereabove, and a pinned layer stacked on the non-magnetic layer, wherein, the magnetoresistance effect film has passive end regions separated by a central active region and the passive end regions are stacked on the pair of magnetic biasing films, and a pair of electrodes for providing a sense current to the magnetoresistance effect film, wherein, when saturation magnetization of the high saturation magnetization magnetic layer is $Ms^{high}$, saturation magnetization of the free layer is $Ms^{free}$, and saturation magnetization of the magnetic hard layer is $Ms^{hard}$, the high saturation magnetization magnetic layers satisfy at least one of $Ms^{high} \geq Ms^{free}$ and $Ms^{high} \geq Ms^{hard}$.

A magnetic head of the present invention comprises a lower magnetic shield, the above described magnetoresistance effect element of the present invention formed on the lower magnetic shield through a lower read magnetic gap, and an upper magnetic shield formed on the magnetoresistance effect element through an upper read magnetic gap.

A magnetic recording/read separation type head of the present invention comprises a read head having a lower magnetic shield, the above described magnetoresistance effect element formed on the lower magnetic shield through a lower read magnetic gap, and an upper magnetic shield formed on the magnetoresistance effect element through an upper read magnetic gap, and a recording head having a lower magnetic pole and the upper magnetic shield being one body, a recording magnetic gap formed on the lower magnetic pole, and an upper magnetic pole disposed on the recording magnetic gap.

A magnetic recording device of the present invention comprises a magnetic recording medium and a head slider provided with the above described magnetic recording/read separation type head of the present invention which writes a signal on the magnetic recording medium through a magnetic field and reads a signal through a magnetic field generated from the magnetic recording medium.

When a magnetoresistance effect head is made to have a narrowed track in order to respond to a higher recording density, pinned at the edge of a free layer becomes important. However, as described above, even if a film thickness of hard magnetic bias films are increased, a bias strength can not be increased effectively, resulting in, on the contrary, sensitivity lowering.

There, as a result of our various studies on a performance and a structure of magnetic biasing films, it is found that, in order to suppress magnetic domain formation at the edges of a free layer, it is important to increase a magnetic flux of a biasing film rather than to increase a magnetic volume ratio of magnetic biasing film to free layer (that is, to increase Mr×t(hard)/Ms×t(free)). That is, it is found that, by using magnetic biasing film having a higher saturation magnetization compared with the free layer, suppression of the magnetic domain formation at the edges of the free layer can be attained.

However, when a Co containing ferromagnetic material such as a CoFe alloy is employed for a free layer, since the saturation magnetization of the free layer itself is large, a magnetic hard layer alone can not suppress the magnetic domain formation at the edges of the free layer. The saturation magnetization of a CoFe alloy is, for example, 1500 emu/cc. Usually, in a CoCrPt based alloy being used in hard magnetic biasing films, the saturation magnetization, though depending on a Cr concentration, is at most 500 emu/cc when about 10 at % of Cr is added. About 800 emu/cc is a limit even for a CoPt based alloy. In such hard magnetic biasing films, from the above mentioned reasons, Barkhausen noise can not be fully suppressed for a track narrowed magnetoresistance effect head.

Thus, in the present invention, a laminate film composed of a hard magnetic layer and a high saturation magnetization magnetic layer is applied in the magnetic biasing film. In a magnetoresistance effect element of the present invention, a laminate film composed of a high saturation magnetization magnetic layer having the saturation magnetization ($Ms^{high}$) equal or more than the saturation magnetization $Ms^{free}$ of a free layer and a magnetic hard layer, or a laminate film composed of a high saturation magnetization magnetic layer having a saturation magnetization ($Ms^{high}$) equal or more than the saturation magnetization $Ms^{hard}$ of a magnetic hard layer and a hard magnetic layer is used as hard magnetic biasing films.

According to a laminate film composed of a high saturation magnetization magnetic layer satisfying $Ms^{high} \geq Ms^{free}$ and a magnetic hard layer, as a free layer in which a Co containing ferromagnetic material, for example, is employed, even for a free layer large in its saturation magnetization, a ferromagnetic bias of a high flux density can be provided with stability and effectively. Therefore, occurrence of Barkhausen noise due to the magnetic domain formation at the edges of a free layer can be effectively suppressed.

Further, although it is usually difficult to heighten the saturation magnetization of a hard magnetic material by it alone, by stacking a high saturation magnetization magnetic layer satisfying $Ms^{high} \geq Ms^{hard}$ with a magnetic hard layer, the saturation magnetization of the magnetic biasing film as a whole can be heightened. In such a case, even to the free layer high in its saturation magnetization, a ferromagnetic bias of a high flux density can be provided with stability and effectively. Therefore, occurrence of Barkhausen noise due to the magnetic domain formation at the edges of a free layer can be effectively suppressed.

In addition, a magnetoresistance effect element of the present invention can be employed in a magnetic memory device such as an MRAM. A magnetic memory device comprises, for example, the above described magnetoresistance effect element of the present invention, a recording electrode for memorizing information in the magnetoresistance effect film, and a read electrode for reading information memorized in the magnetoresistance effect film.

DESCRIPTION OF THE PREFERRED EMBODIMENTS

In the following, some embodiments for implementing the present invention will be described with reference to the drawings.

Figure 1:
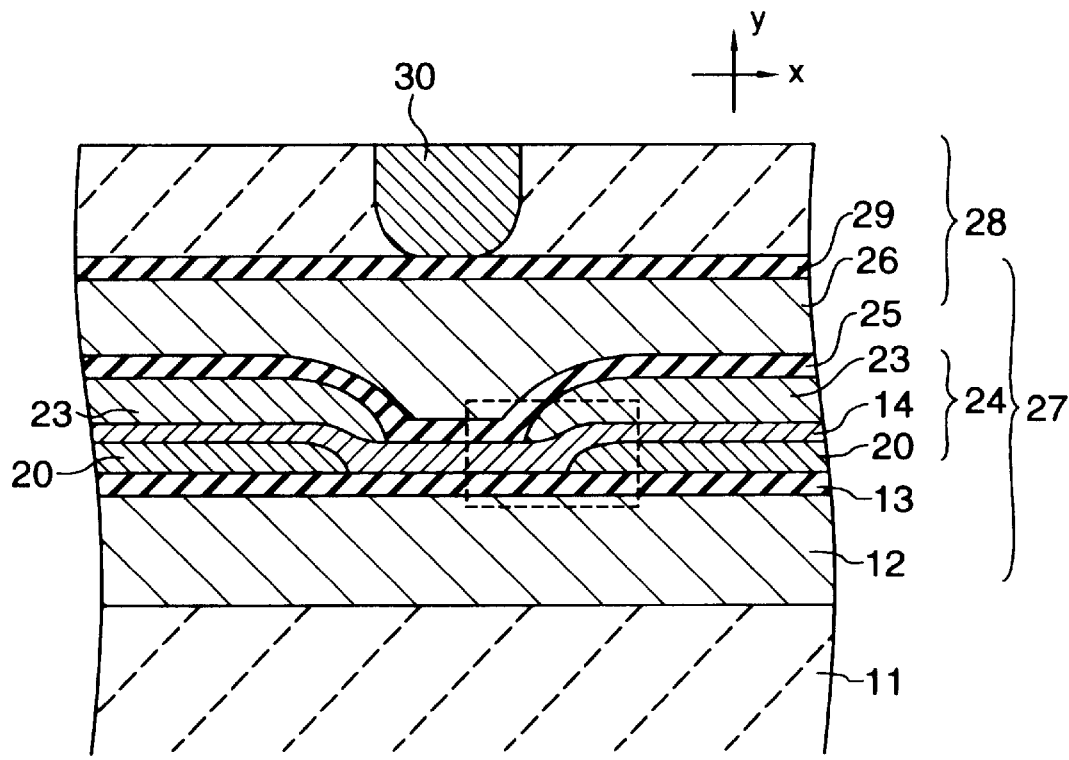
FIG. 1 is a sectional view showing a structure of a first embodiment of a magnetic recording/read separation type head in which a magnetoresistance effect element of the present invention is applied in a read element portion.
Figure 2:
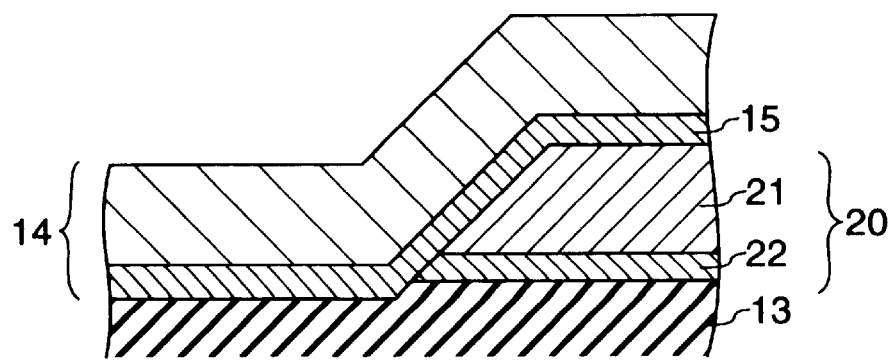
FIG. 2 is a sectional view showing in an exploded manner an essential portion of a magnetoresistance effect head in the magnetic recording/read separation type head shown in FIG. 1.
Figure 3:
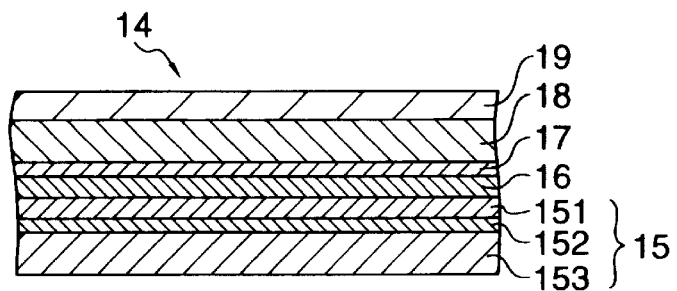
FIG. 3 is a sectional view showing in an exploded manner a portion of a magnetoresistance effect film of the magnetoresistance effect head shown in FIG. 1.

At first, an embodiment of a magnetic recording/read separation type head in which a magnetoresistance effect element of the present invention is employed for a read element portion will be described. FIG. 1, FIG. 2 and FIG. 3 are diagrams showing structures of a first embodiment of a magnetic recording/read separation type head in which a magnetoresistance effect element of the present invention is applied for a read element portion. FIG. 1 is a sectional view of the magnetic recording/read separation type head seen from an air bearing surface direction. In FIG. 1, x-direction is a recording track width direction, y-direction is a recording track running direction corresponding a film thickness direction. FIG. 2 is a sectional view showing an essential portion of FIG. 1 (portion surrounded by a dotted line in FIG. 1) in an exploded manner, FIG. 3 is a magnetoresistance effect film portion shown in an exploded manner.

In these figures, numeral 11 shows a substrate. As the substrate 11, an $Al_2O_3$/TiC substrate having an $Al_2O_3$ layer can be used. On one main surface of such a substrate 11, a lower magnetic shield layer 12 consisting of a soft magnetic material such as a NiFe alloy, an FeSiAl alloy, an amorphous CoZrNb alloy is formed. On the lower magnetic shield layer 12, a magnetoresistance effect film (MR film) 14 is formed through a lower read magnetic gap 13 consisting of a non-magnetic material such as $AlO_X$.

The MR film 14 is a so-called spin valve film (spin valve GMR film) which possesses, as shown in FIG. 3, a magnetic multi-layer film stacked in turn a free layer 15 which varies its magnetization direction according to at least an external magnetic field, a non-magnetic layer 16, a pinned layer 17 and an antiferromagnetic layer 18, and displays a giant magnetoresistance effect. The free layer 15 possesses a Co containing ferromagnetic layer 151 such as a CoFe alloy layer or a CoFeB alloy layer and the Co containing ferromagnetic layer 151 is disposed contacting with the non-magnetic layer 16.

The Co containing ferromagnetic layer 151, to enhance soft magnetic properties as a free layer 15, is formed on, for instance, a magnetic under layer. For the magnetic under layer, an amorphous soft magnetic material such as a CoZrNb and the like or a crystalline soft magnetic material such as a NiFe alloy, a NiFeCo alloy and magnetic alloys added various kinds of elements thereto can be used. As the crystalline soft magnetic material, a soft magnetic material having face-centered cubic crystal structure is preferred. In this embodiment, below the Co containing ferromagnetic layer 151, as a magnetic under layer, a NiFe alloy layer 152 and an amorphous CoZrNb alloy layer 153 are disposed in turn. With these respective layers 151, 152, 153, the free layer 15 is constituted.

The pinned layer 17 is disposed on the free layer 15 through the non-magnetic layer 16 consisting of Cu, Au, Ag and alloys thereof. The pinned layer 17 is consisting of a Co containing ferromagnetic material such as a CoFe alloy as identical as the free layer 15 is. The pinned layer 17 is pinned magnetically through an exchange coupling with an antiferromagnetic layer 18 consisting of an IrMn alloy, a PtMn alloy, a NiMn alloy, an FeMn alloy. Here, in the figure, numeral 19 is a protective film consisting of Ta or Ti, and is formed as demands arise.

Further, for the free layer 15 and the pinned layer 17, a NiFe alloy such as $Ni_{80}Fe_{20}$ (at %) can be used.

As a specific constitution of the spin valve GMR film 14, a constitution of amorphous CoZrNb (7 nm) 153/NiFe (1 nm) 152/CoFe (3 nm) 151/Cu (3 nm) 16/CoFe (2 nm) 17/IrMn (8 nm) 18/Ta (5 nm) 19 stacked in turn from a substrate side can be cited. As a specific constitution of a spin valve GMR film when a NiFe alloy is used in the free layer or the pinned layer, a constitution stacked from the substrate side in order of NiFe (6 nm)/Co (1 nm)/Cu (3 nm)/Co (1 nm)/NiFe (2 nm)/IrMn (5.5 nm)/Ta (5 nm) or NiFe (6 nm)/CoFe (1 nm)/Cu (3 nm)/CoFe (2 nm)/IrMn (7 nm)/Ta (5 nm) or NiFe (6 nm)/CoFe (1 nm)/Cu (3 nm)/CoFe (3 nm)/Ru (0.8 nm)/CoFe (3 nm)/IrMn (7 nm)/Ta (5 nm) can be cited.

A spin valve GMR film 14 employed a Co containing ferromagnetic material such as a CoFe alloy for a part of a free layer 15 (151) and a pinned layer 17 displays, together with a large MR change rate, heat resistance during head formation process and a long term reliability. As a Co containing ferromagnetic material, Co or a Co based alloy (Co based magnetic alloy) obtained by adding Fe, Ni, and others to Co can be cited, the Co alloy being particularly preferred. As an addition element to the Co alloy, other than Fe or Ni, one kind or more than 2 of Pd, Au, Ag, Cu, Pt, Ir, Rh, Ru, Os, Hf, B, Al, Si can be used. An addition amount of these elements is preferable to be in the range of 5 to 50 at %. In particular, employing of a CoFe alloy containing Fe in the range of 5 to 40 at % is desirable from the view point of the MR change rate or the exchange coupling force with an antiferromagnetic layer 18.

Between the spin valve GMR film 14 and the lower read magnetic gap 13, on area off a track width, a pair of hard magnetic biasing films 20 for providing a bias magnetic field to the spin valve GMR film 14 are formed in advance. The pair of hard magnetic biasing films 20 are disposed with a predetermined gap. That is, outside portions than the read track of the spin valve GMR film 14 are respectively stacked on each of the hard magnetic biasing films 20. The spin valve GMR film 14 has passive end regions separated by a central active region and the passive end regions are stacked on the pair of hard magnetic biasing films 20.

The hard magnetic biasing films 20, as shown in FIG. 2, possesses a laminate film composed of a Co based magnetic hard layer 21 consisting of a Co containing hard magnetic material such as a CoPt alloy or a CoCrPt alloy, for example, and a high saturation magnetization magnetic layer (high Ms magnetic layer) 22. As a specific constitution of the laminate film, as shown in FIG. 2, for example, a laminate film stacked a Co based magnetic hard layer 21 on a high Ms magnetic layer 22 can be cited. In such a laminate film, the high Ms magnetic layer 22 functions as a magnetic under layer of the Co based magnetic hard layer 21. Further below the high Ms magnetic layer 22, a non-magnetic under layer such as a Cr layer can be disposed as demands arise. Here, in the spin valve GMR film 14 shown in FIG. 2, the film constitution other than the free layer 15 is omitted.

And, the high Ms magnetic layer 22, when saturation magnetization thereof is $Ms^{high}$, saturation magnetization of the free layer 15 is $Ms^{free}$, saturation magnetization of the Co based magnetic hard layer 21 is $Ms^{hard}$, satisfies at least one relationship of $Ms^{high} \geq Ms^{free}$ and $Ms^{high} \geq Ms^{hard}$. It is more preferable to satisfy both of them. Further, saturation magnetization $Ms^{free}$ of the free layer 15 is an average value when the free layer 15 has a stacked structure.

In this embodiment, since the free layer 15 is disposed at the most bottom position of the spin valve GMR film 14 and the high Ms magnetic layer 22 is formed below the Co based magnetic hard layer 21 as a magnetic under layer, the edge portions of the read track of the free layer 15 abut on the high Ms magnetic layer 22. Therefore, to the free layer 15, an exchange bias accompanying exchange coupling with the high Ms magnetic layer 22 and ferromagnetic bias mainly based on the high Ms magnetic layer 22 are provided. Further, since the free layer 15 is directly stacked on the hard magnetic biasing films 20, exchange bias accompanying exchange coupling between the Co based magnetic hard layer 21 and the free layer 15 at this part is also added. Thereby, a biasing magnetic field is provided to the free layer 15.

On the spin valve GMR film 14, a pair of electrodes 23 consisting of Cu, Au, Zr, Ta and the like are formed. To the spin valve GMR film 14, a sense current is provided from the pair of electrodes. Further, a substantial read track width of the spin valve GMR film 14 is specified by the distance between the pair of electrodes 23. These of the spin valve GMR film 14, the pair of hard magnetic biasing films 20 and the pair of electrodes 23 constitute a GMR read element portion 24.

The GMR read element portion 24 can be produced in the following manner, for example. That is, at first, on a lower read magnetic gap 13 consisting of $AlO_X$ film, a high Ms magnetic layer 22 and a Co based magnetic hard layer 21 are formed in turn. The laminate film, by milling after executing PEP process, is patterned to form a pair of hard magnetic biasing films 20 disposed with a predetermined gap. In this case, usually by forming a spacing of a pair of hard magnetic biasing films 20 broader than a spacing of a pair of electrodes 23, with the spacing of the pair of electrodes 23, a substantial width of a read track as a magnetic field detecting portion of the spin valve GMR film 14 is provided. The patterning of the hard magnetic biasing films 20 can also be executed by a lift-off method.

Then, on the patterned pair of hard magnetic biasing films 20, each layer constituting a spin valve GMR film 14 is formed in turn. By milling the magnetic multi-layer film after execution of PEP process, the spin valve GMR film 14 is patterned. The patterning of the spin valve GMR film 14 also can be implemented by the lift-off method as identical as the hard magnetic biasing films 20. Thereafter, a conductive material film destined to be the electrodes 23 is formed, and, by patterning it with the lift-off method, a pair of electrodes 23 are formed. Thus, a GMR read element portion 24 of an overlaid structure can be obtained.

The GMR read element portion 24 of an overlaid structure, since the spin valve GMR film 14 and the electrodes 23 contact on the film plane, decreases in its read resistance and has an advantage that the occurrence of electrostatic destruction (ESD) is less probable.

On the above described GMR read element portion 24, an upper magnetic shield layer 26 is formed through an upper read magnetic gap 25. The upper read magnetic gap 25 is made of a non-magnetic insulation material identical as that of the lower read magnetic gap 13. The upper magnetic shield layer 26 is made up of a soft magnetic material identical as that of the lower magnetic shield layer 12. With these respective elements, a shield type GMR head 27 as a read head is constituted.

On the shield type GMR head 27, a thin film magnetic head 28 is formed as a recording head. A lower recording magnetic pole of the thin film magnetic head 28 is made of a magnetic layer identical as the upper magnetic shield layer 26. That is, the upper magnetic shield layer 26 of the shield type MR head 27 and the lower recording magnetic pole of the thin film magnetic head 28 are one body. On the lower recording magnetic pole 26 being one body with the upper magnetic shield layer, a recording magnetic gap 29 consisting of a non-magnetic insulation material such as an $AlO_X$ and an upper recording magnetic pole 30 are formed in turn. A recording coil (not shown in the figure) providing a recording magnetic field to the lower recording magnetic pole 26 and the upper recording magnetic pole 30 is disposed at the behind side than the air bearing surface. With these respective elements, a thin film magnetic head 28 as a recording head is constituted.

In the above described shield type GMR film 27, when a high Ms magnetic layer 22 has a saturation magnetization $Ms^{high}$ ($\geq Ms^{free}$) equal or more than the saturation magnetization $Ms^{free}$ of a free layer 15, in addition to an exchange bias resulting from exchange coupling between the free layer 15 and the high Ms magnetic layer 22 and exchange bias accompanying exchange coupling between the Co based magnetic hard layer 21 and the free layer 15, ferromagnetic bias of a high flux density can be provided at the edges of the free layer 15.

Thereby, even when the free layer 15 has a Co containing ferromagnetic layer 151 high in its saturation magnetization, an effective and stable biasing magnetic field can be provided. Therefore, occurrence of Barkhausen noise resulting from magnetic domain formation at the edge portions of the free layer 15 can be effectively suppressed. When the free layer 15 is disposed as the most bottom layer of the spin valve GMR film 14, since the free layer 15 can be directly exchange coupled with the high Ms magnetic layer 22, it can be said that this makeup is desirable one as a bias structure of the present invention.

In addition, though the saturation magnetization Ms of a hard magnetic material by itself does not usually become large, by forming a hard magnetic layer 21 on the high Ms magnetic layer 22, the Ms of the hard magnetic biasing films as a whole can be improved. Thus, also by enhancing the Ms of the hard magnetic biasing films 20 as a whole by using the high Ms magnetic layer 22, ferromagnetic bias of a high flux density can be provided to the edges of the free layer 15. Therefore, the occurrence of Barkhausen noise resulting from the magnetic domain formation at the edges of the free layer 15 can be effectively suppressed.

To realize such a state, for the high Ms magnetic layer 22, a magnetic material layer having a saturation magnetization $Ms^{high}$ equal or more than the saturation magnetization $Ms^{hard}$ of the hard magnetic layers 21, namely, satisfying $Ms^{high} \geq Ms^{hard}$ is used. In other words, by employing a high Ms magnetic layer 22 satisfying $Ms^{high} \geq Ms^{hard}$, the occurrence of Barkhausen noise resulting from the magnetic domain formation at the edges of the free layer 15 can be effectively suppressed.

The high Ms magnetic layer 22 can have a saturation magnetization $Ms^{high}$ satisfying at least one of $Ms^{high} \geq Ms^{free}$ and $Ms^{high} \geq Ms^{hard}$. In order to obtain a further stable suppression effect of Barkhausen noise, the high Ms magnetic layer 22 is preferable to satisfy both of $Ms^{high} \geq Ms^{free}$ and $Ms^{high} \geq Ms^{hard}$. Further, at the same time with making high the Ms of the high Ms magnetic layer 22, though making high the $Hk^{grain}$ of the hard magnetic layer 21 is also important, since the high Ms magnetic layer 22 concurrently works as the seed layer of the magnetic hard layer 21, due to selection of material, such a performance can be sufficiently satisfied.

Figure 4:
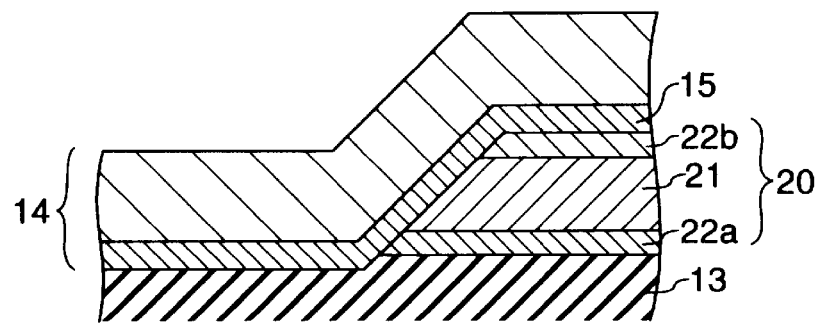
FIG. 4 is a sectional view showing an essential portion of a first modification example of the magnetoresistance effect head shown in FIG. 1.

In the hard magnetic biasing films 20 shown in FIG. 2, a biasing effect at the upper portion thereof is limited only to an exchange bias accompanying exchange coupling between the hard magnetic layer 21 and the free layer 15 as identical as a conventional overlaid structure. To such a point, as shown in FIG. 4, for instance, on a magnetic hard layer 21, a second high Ms magnetic layer 22b can be formed. In FIG. 4, numeral 22a is a first high Ms magnetic layer as a seed layer. According to such a structure, a biasing effect due to a magnetic flux penetrating from the outside portions (tail portions) than both edge portions of a read track can be expected. A condition of a second high Ms magnetic layer 22b is identical as that of the first high Ms magnetic layer 22a as the seed layer.

Figure 5:
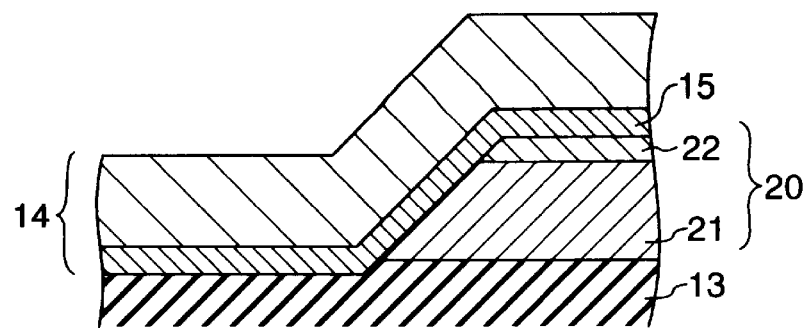
FIG. 5 is a sectional view showing an essential portion of a second modification example of the magnetoresistance effect head shown in FIG. 1.

Further, as shown in FIG. 5, even in hard magnetic biasing films 20 in which the high Ms magnetic layers 22 are formed only on the hard magnetic layers 21, since the biasing effect due to magnetic flux being intruded from the above described tail portions can be expected, compared with the hard magnetic biasing films of the conventional hard magnetic layer alone, the occurrence of Barkhausen noise can be suppressed.

Here, when a NiFe alloy or the like is used for the free layer, since their saturation magnetization are as small as about 800 emu/cc or less, even in the hard magnetic biasing film of a magnetic hard layer alone, their saturation magnetizations do not cause much problem. On the contrary, when a Co containing ferromagnetic material with, for example, 800 emu/cc or more in its Ms (Ms of a CoFe alloy is about 1500 emu/cc, for example) is applied in the free layer 15, the noise occurs remarkably due to the small saturation magnetization of the hard magnetic biasing films 20 as compared with the free layer 15. The present invention is particularly to solve the problem occurring when the free layer 15 of such a high Ms is employed. However, even when mainly a NiFe alloy layer or the like is employed for the free layer, by employing a high Ms magnetic layer 22, the biasing magnetic field can be effectively provided. Therefore, the noise occurrence can be further suppressed.

Further, as described above, as the track width decreases, the pinning at the edges of the free layer 15 becomes important. While a conventional biasing structure could not sufficiently suppress the occurrence of Barkhausen noise, the biasing structure of the present invention, as described above, can effectively input the biasing magnetic field to the edges of the free layer 15. Thus, the present invention can suppress increase of Barkhausen noise due to the track width narrowing. In specific, in case where the length of the track width direction (x) of a spin valve GMR film 14 is 3 $\mu$m or less, the present invention is particularly effective.

The specific saturation magnetization $Ms^{high}$ of the high Ms magnetic layer 22, in order to input sufficient ferromagnetic bias of high magnetic flux density to various kinds of the free layers 15, is preferable to be 1000 emu/cc or more. In order to suppress also variation of the magnetization direction of the hard magnetic biasing films 20 accompanying magnetization rotation of the free layer 15, the saturation magnetization $Ms^{high}$ of the high Ms magnetic layer 22 is preferable to be 1000 emu/cc or more. The variation of the magnetization direction of the hard magnetic biasing films 20 accompanying magnetization rotation of the free layer 15 can also be a cause of the occurrence of Barkhausen noise.

Figure 6:
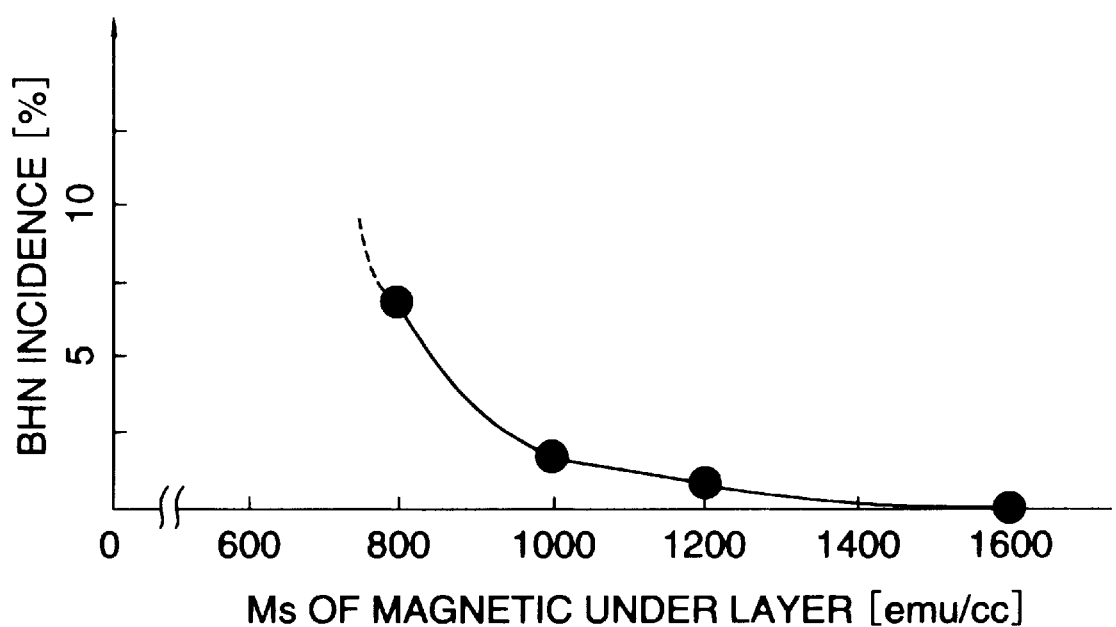
FIG. 6 is a diagram showing relationship between saturation magnetization $Ms^{high}$ of high Ms magnetic layer and incidence of Barkhausen noise.

In FIG. 6, relationship between saturation magnetization $Ms^{high}$ of high Ms magnetic layer 22 and incidence of Barkhausen noise is shown. It is evident that, when an $Ms^{high}$ is 1000 emu/cc or more, the incidence of Barkhausen noise becomes small particularly.

Here, the incidence of Barkhausen noise is obtained by employing only one-side shielded (without upper magnetic shield) micro-elements in place of real heads (same in its size with a real head, the size of a height direction is determined by patterning with PEP instead of polishing). Whether Barkhausen noise occurred or not is judged after the following manner, that is, when magnetostatic characteristics ($\rho$-H curve) of a micro-element is measured, if there is no jump found in its $\rho$-H curve, it is judged that no Barkhausen noise occurred, and if any jump can be found in its $\rho$-H curve, it is judged that there was Barkhausen noise. An incidence of Barkhausen noise is obtained in the following manner. At first, a certain number of the micro-elements of same parameter are measured, then the number of the micro-elements which displayed Barkhausen noise is divided by the total number of the measured micro-elements followed by multiplying 100 to obtain the incidence of Barkhausen noise. The incidence of Barkhausen noise shown in the following is also obtained in the same manner.

Further, when suppressing the variation of the magnetization direction of the hard magnetic biasing films 20 accompanying magnetization rotation of the free layer 15, it is preferable a total remanent magnetization $Mr^{total}$ of a laminate film composed of a high Ms magnetic layer 22 and a magnetic hard layer 21 to be 600 emu/cc or more. The hard magnetic biasing films 20 possessing such a high remanent magnetization (high Mr) and such a low dispersion (high squareness ratio S) can suppress variation of magnetization direction of the hard magnetic biasing films 20 accompanying magnetization rotation of the free layer 15. Therefore, to the free layer 15, a stable and effective biasing magnetic field can be provided. When the $Mr^{total}$ is 600 emu/cc or more, in particular, the incidence of Barkhausen noise becomes low.

As a specific constituent material of the high Ms magnetic layer, various kinds of magnetic materials satisfying at least one condition of $Ms^{high} \geq Ms^{free}$ and $Ms^{high} \geq Ms^{hard}$ described above can be used. For instance, an FeCo alloy, an FeZr alloy, an FeZrN alloy, an amorphous CoZrNb alloy can be cited. In particular, an FeCo alloy which has a large saturation magnetization and promotes in-plane hard magnetic characteristics of the hard magnetic layers 21 such as CoPt stacked thereon is preferable.

Figure 7:
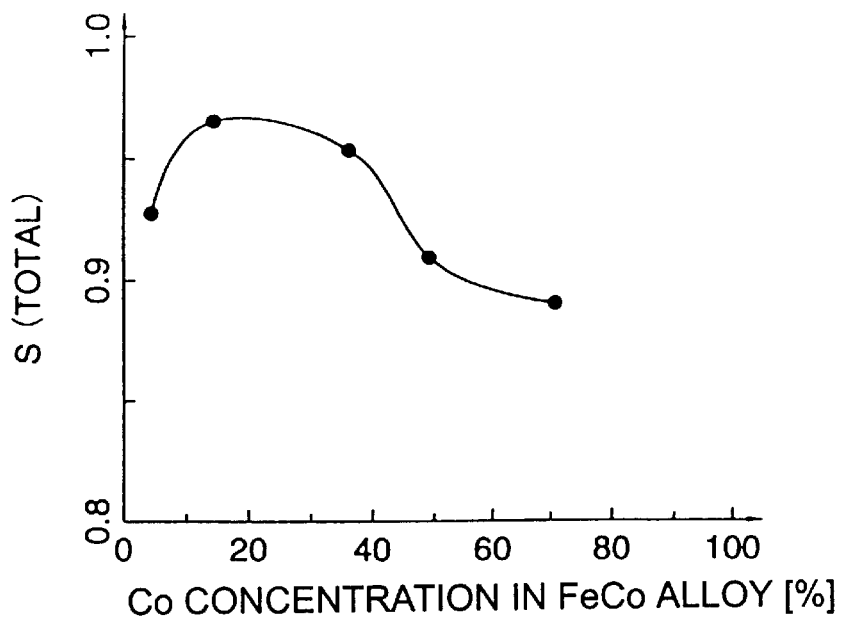
FIG. 7 is a diagram showing Co concentration dependency in FeCo alloy and squareness ratio $S^{total}$ of laminate film composed of FeCo alloy film and CoPt film.
Figure 8:
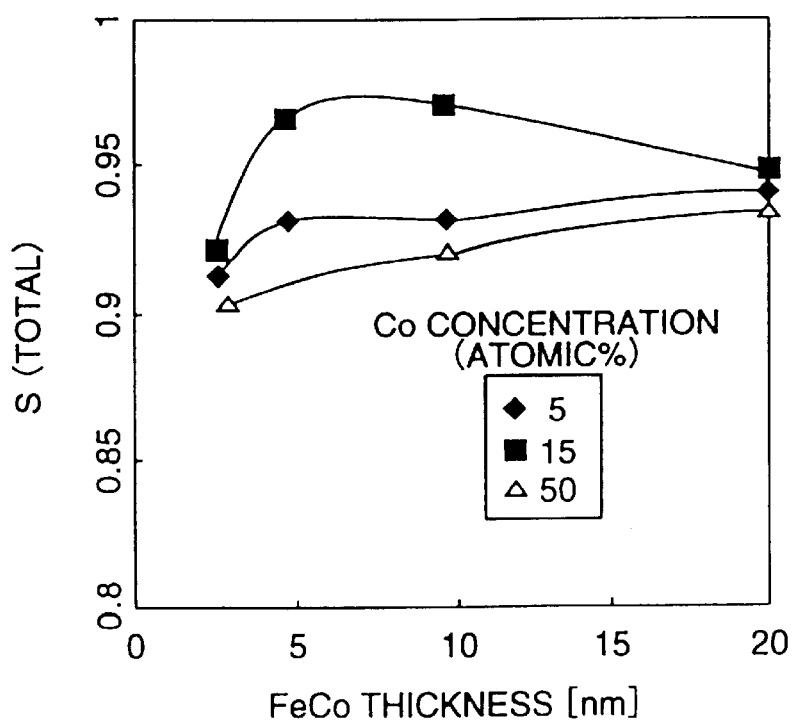
FIG. 8 is a diagram showing relationship between film thickness of an FeCo alloy film and squareness ratio $S^{total}$ of laminate film composed of FeCo alloy film and CoPt film when Co concentration is varied.

In Table 1, magnetic characteristics of FeCo alloy of various kinds of compositions (coercive force Hc and saturation magnetization Ms at the film thickness of 5 nm of the FeCo alloy film) are shown. In FIG. 7 and FIG. 8, Co concentration dependencies of squareness ratio S of the FeCo alloy are shown. Further, FIG. 7 shows a total squareness ratio $S^{total}$ of a film stacked a CoPt film of a thickness of 22 nm on an FeCo alloy film of a thickness of 5 nm and FIG. 8 shows a relationship between film thicknesses of FeCo alloy films and squareness ratios $S^{total}$ of the stacked films when the Co concentration is varied.

TABLE 1

| FeCo alloy composition (at %) | $Fe_{85}Co_{15}$ | $Fe_{95}Co_5$ | $Fe_{50}Co_{50}$ |
|---|---|---|---|
| Coercive force Hc (Oe) | 19 | 20 | 30 |
| Saturation magnetization Ms (emu/cc) | 1600 | 1425 | 1675 |

From Table 1, FIG. 7 and FIG. 8, Co concentration in FeCo alloy is found to be preferable to be 40 at % or less in order to obtain the high Ms and the high S. Besides, since, when the Co concentration is too low, the corrosive resistance decreases, the Co concentration in the FeCo alloy is preferable to be 5 at % or more. Thus, an FeCo alloy containing Co in the range of 5 to 40 at % is particularly preferable for a constituent material of the high Ms magnetic layer 22.

For hard magnetic layers 21, various kinds of Co based hard magnetic alloys such as a CoPt alloy or a CoCrPt alloy can be used. Though these Co based hard magnetic alloys are excellent in their hard magnetism and corrosion resistance, for materializing high Hc and high Mr through exchange coupling with the high Ms magnetic layer 22, a hard magnetic material of high Ms is desirable to be used. From these, CoPt alloy is superior to, for example, CoCrPt alloy for the hard magnetic layer 21.

The film thicknesses of high Ms magnetic layer 22 and magnetic hard layer 21 are desirable to be determined considering ferromagnetic biasing effect of high magnetic flux density due to the above described high Ms magnetic layer 22 and the coercive force $Hc^{total}$ of the hard magnetic biasing films 20 as a whole. For instance, if a film thickness of high Ms magnetic layer 22 is made too thick, the coercive force $Hc^{total}$ of a hard magnetic biasing film as a whole decreases. If film thickness of the high Ms magnetic layer 22 is too thin, an effect due to the ferromagnetic bias can not be obtained sufficiently. Therefore, the film thickness of the high Ms magnetic layer 22 is preferred to be in the range of 3 to 20 nm.

Besides, if the hard magnetic layer 21 is made too thick, the ferromagnetic bias becomes too strong to result in the sensitivity decrease. Further, since also in-plane orientation of c-axis of hard magnetic layer 21 decreases, the coercive force Hc and the squareness ratio S are caused to be decreased. From these, the film thickness of the magnetic hard layer 21 is preferable to be made 100 nm or less, further preferable to be 50 nm or less.

For the specific film thickness ratio between the high Ms magnetic layer 22 and the hard magnetic layer 21, when, for instance, an FeCo alloy film is used for the high Ms magnetic layer 22 and a CoPt alloy film is used for the magnetic hard layer 21, in the case where film thickness of the FeCo alloy film is about 5 nm, the film thickness of the CoPt alloy film is preferred to be set in the range of 15 to 100 nm, further preferable to be in the range of 20 to 50 nm. In the case where the film thickness of the FeCo alloy film is about 10 nm, the film thickness of the CoPt alloy film is preferable to be in the range of 20 to 100 nm, further preferable to be in the range of 30 to 60 nm. In the case where the film thickness of the FeCo alloy film is about 20 nm, the film thickness of the CoPt alloy film is preferable to be in the range of 25 to 100 nm. When a high Ms magnetic layer (second high Ms magnetic layer 22b) is further formed on the upper side of the hard magnetic layer 21, its thickness is preferable to be about 3 to 10 nm.

As a specific constitution of hard magnetic biasing films 20 suitable for the present invention, a laminate film composed of a Co based magnetic hard layer 21 consisting of a CoPt alloy and a high Ms magnetic layer 22 consisting of an FeCo alloy can be cited. In particular, a laminate film composed of the magnetic hard layer 21 consisting of $Co_{80}Pt_{20}$ and the high Ms magnetic layer 22 consisting of $Fe_{85}Co_{15}$ is a desirable make-up.

Magnetic characteristics of a specific laminate film will be described. On an $AlO_X$ gap, a laminate film of $Fe_{85}Co_{15}$ (5 nm)/$Co_{80}Pt_{20}$ (40 nm) is formed in the same vacuum with magnetron-sputtering method. The magnetic characteristics of the laminate film displayed an integrated M-H curve through exchange coupling of 2 layers. At this time, in-plane coercive force $Hc^{total}$ is 1050 Oe, remanent magnetization $Mr^{total}$ is 980 emu/cc, and squareness ratio S is 0.94.

By combining a high Ms magnetic layer 22 consisting of an FeCo alloy and a magnetic hard layer 21 consisting of a CoPt alloy, even on an FeCo high Ms magnetic layer 22 which has a CoPt magnetic hard layer 21 as a magnetic under layer, while satisfying a coercive force practically non-problematic, a high Mr and a low dispersion (high S) not materialized by a single layer of a CoPt magnetic hard layer can be realized.

Figure 9:
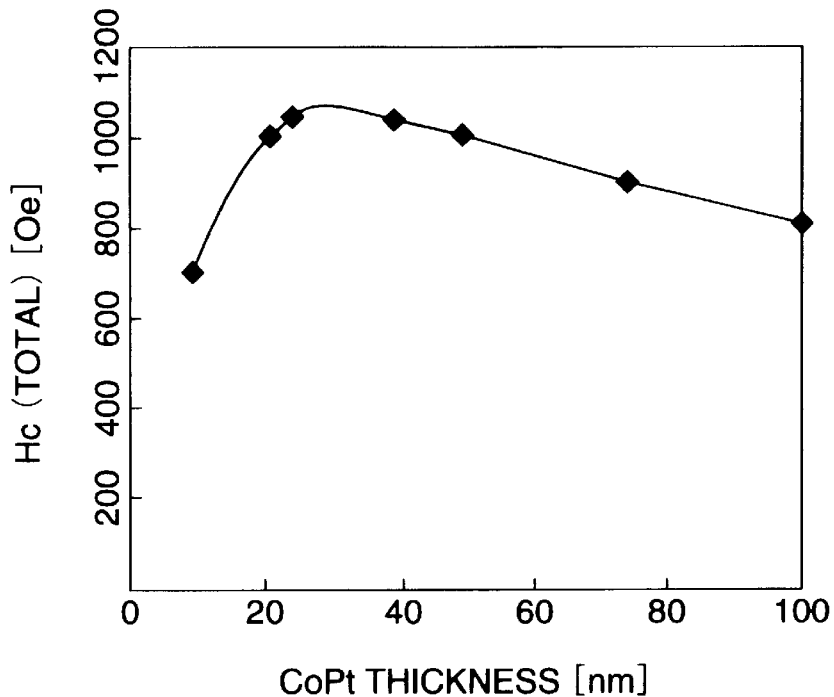
FIG. 9 is a diagram showing relationship between film thickness of CoPt alloy film and coercive force $Hc^{total}$ of laminate film composed of FeCo alloy film and CoPt film.
Figure 10:
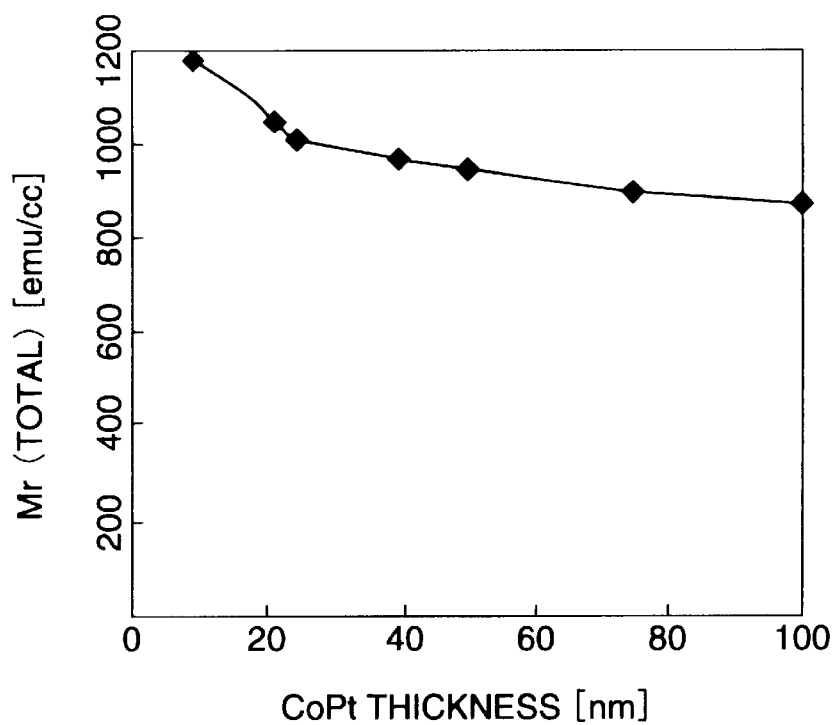
FIG. 10 is a diagram showing relationship between film thickness of CoPt alloy film and remanent magnetization $Mr^{total}$ of laminate film composed of FeCo alloy film and CoPt film.
Figure 11:
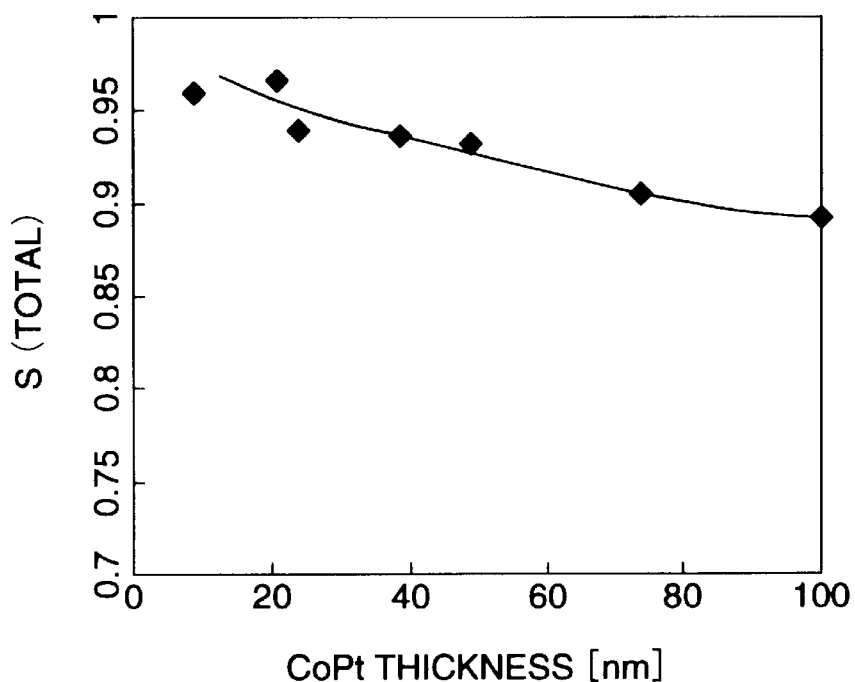
FIG. 11 is a diagram showing relationship between film thickness of CoPt alloy film and squareness ratio $S^{total}$ of laminate film composed of FeCo alloy film and CoPt film.

Here, the magnetic characteristics of the laminate films are shown in FIG. 9, FIG. 10 and FIG. 11, which are obtained by varying the film thickness of the CoPt alloy film while maintaining film thickness of FeCo alloy film at 5 nm. From FIG. 9, when the film thickness of the CoPt alloy is increased, the Hc decreases a little at 40 nm or more but, thanks to the effect of the FeCo alloy film as a seed layer, the decrease of the Hc is suppressed in the practically non-problematic range. On the contrary, when the film thickness of the CoPt alloy is made thin, thanks to the relation of the magnetic volume ratio when exchange coupled with the FeCo alloy film, the coercive force decreases, but, there is no problem if the coercive force is in the range shown in FIG. 9.

Figure 12:
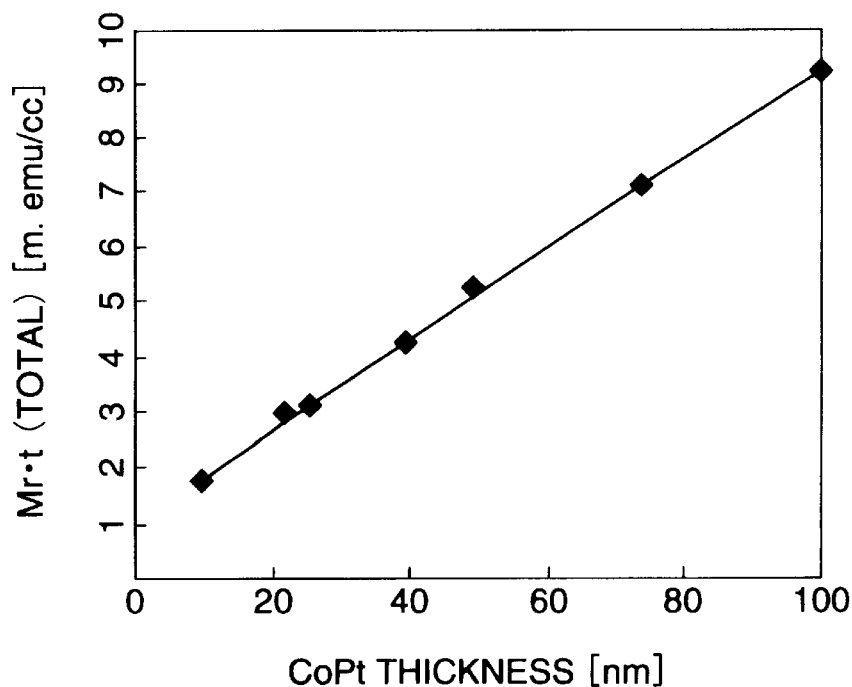
FIG. 12 is a diagram showing relationship between film thickness of CoPt alloy film and $Mr^{(total)} \times t$ of laminate film composed of FeCo alloy film and CoPt film.

From FIG. 10, it is found that, due to the effect of FeCo alloy film of high Ms, the total $Mr^{total}$ of a laminate film of 2 layers realizes high Mr of 800 emu/cc or more at all film thicknesses. Hard magnetic biasing films of such high Ms not materialized by a single hard magnetic layer can be obtained by stacking with the FeCo alloy film of high Ms. From FIG. 11, it is found that the squareness ratio $S^{total}$ is also very high in the region where the film thickness of CoPt alloy film is thin, that is, a film of low dispersion is obtained. Even if the film thickness of the CoPt alloy film is increased up to 80 nm, it still shows a high value of 0.9, and, it is found that, due to the effect of FeCo alloy film, the perpendicular orientation of c-axis due to film thickness increase of CoPt alloy film is suppressed. This is also obvious from FIG. 12; the film thickness of the CoPt alloy film and the magnetic volume(Mrxt$^{(total)}$ (t: film thickness)) displays a very good linearity, the Mrxt$^{(total)}$ does not show any deviation from the linear relationship due to increase of the film thickness of the CoPt alloy film.

Then, another embodiment of a magnetic recording/read separation type head in which a magnetoresistance effect element of the present invention is employed for a read element portion will be described with reference to FIG. 13, FIG. 14 and FIG. 15.

Figure 13:
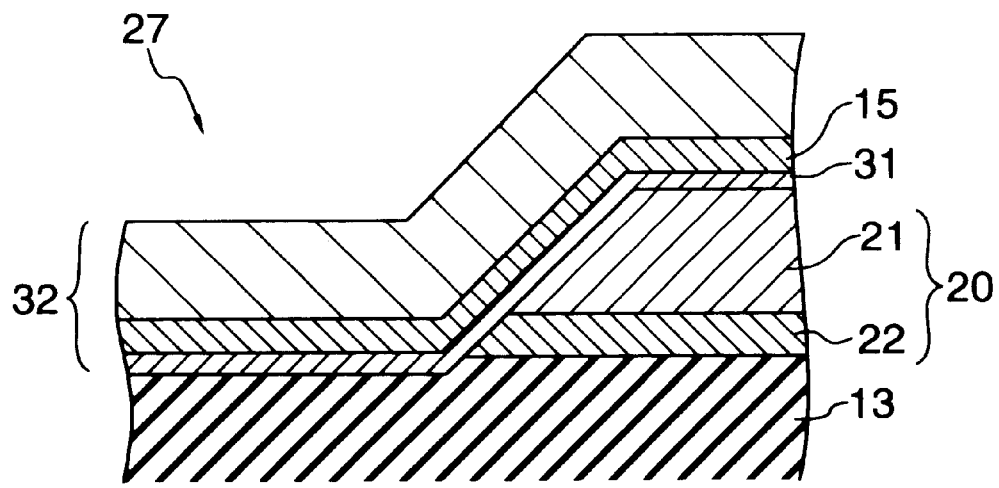
FIG. 13 is a sectional view showing an essential portion of a second embodiment of a magnetic head in which a magnetoresistance effect element of the present invention is employed.

FIG. 13 is a sectional view showing an essential portion of a shield type GMR head of the present invention. Here, the whole structure of the shield type GMR head and the whole structure of the magnetic recording/read separation type head in which the shield type GMR head is employed as a read head are identical as that of FIG. 1 The shield type GMR head 27 of which essential part is shown in FIG. 13 has a spin valve GMR film 32 in which a non-magnetic under layer 31 consisting of Ta and the like is disposed as a under layer of the free layer 15.

Figure 14:
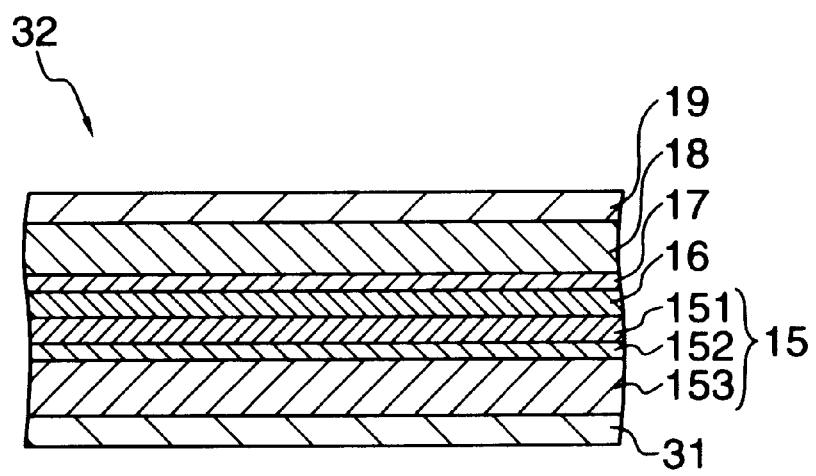
FIG. 14 is a sectional view showing in an exploded manner a magnetoresistance effect element portion of the magnetic head shown in FIG. 13.

A specific constitution of a spin valve GMR film 32 is formed by stacking, as shown in FIG. 14, on the non-magnetic under layer 31, a magnetic film identical as that of FIG. 3; a film stacked a free layer 15, a non-magnetic layer 16, a pinned layer 17, an antiferromagnetic layer 18 and a protective film 19 in turn. Here, the constitution other than the spin valve GMR film 32 is identical as that of the above described embodiment.

The non-magnetic under layer 31 consisting of Ta and the like is formed in order to enhance thermal stability when exposed to manufacturing process and long term thermal stability when the spin valve GMR film is formed on the lower read magnetic gap 13 consisting of AlO$_X$ film of large surface ruggedness. When the spin valve GMR film 32 having such a non-magnetic under layer 31 is used, between the free layer 15 and the hard magnetic biasing films 20, in particular, the high Ms magnetic layer 22, the non-magnetic film is interposed. Therefore, being magnetically disconnected therebetween, the exchange coupling between the free layer 15 and the hard magnetic biasing films 20 becomes weak, or, further, the exchange coupling is cut.

In such an element structure, since the present invention uses a laminate film composed of a high Ms magnetic layer 22 satisfying at least one condition of Ms$^{high}$≧Ms$^{free}$ and Ms$^{high}$≧Ms$^{hard}$ and a magnetic hard layer 21 for the hard magnetic biasing films 20, a ferromagnetic bias of high magnetic flux density can be provided at the edges of the free layer 15. Therefore, even when a Co containing ferromagnetic layer 151 large in its saturation magnetization is applied to the free layer 15, stable and effective bias magnetic field can be provided and occurrence of Barkhausen noise due to magnetic domain formation at the edges of the free layer 15 can be suppressed.

As a specific example of the embodiment, a multi-layer film of Ta (5 nm)/NiFe (6 nm)/CoFe (1.5 nm)/Cu (3 nm)/CoFe (2 nm)/IrMn (8 nm)/Ta (5 nm) structure is used for the spin valve GMR film 32 and a stacked film of FeCo (5 nm)/CoPt (35 nm) structure is used for the hard magnetic biasing films 20 to produce a spin valve GMR element. Further, as comparative example of the present invention, a spin valve GMR element of identical structure other than to use a stacked film of Cr (5 nm)/CoPt (45 nm) structure for the hard magnetic biasing films is produced.

The incidence of Barkhausen noise of each spin valve GMR element according to these embodiments and the comparative example is investigated. As a result, the Mr$^{total}$ of the hard magnetic biasing films of the embodiment and the comparative example are almost identical, while the incidence of Barkhausen noise of the spin valve GMR elements of the embodiment was 0%, the spin valve GMR elements of the comparative example displayed 15% of incidence of Barkhausen noise. Thus, by employing hard magnetic biasing films 20 consisting of a laminate film composed of a high Ms magnetic layer 22 and a magnetic hard layer 21, Barkhausen noise can be effectively prevented from occurring.

Figure 15:
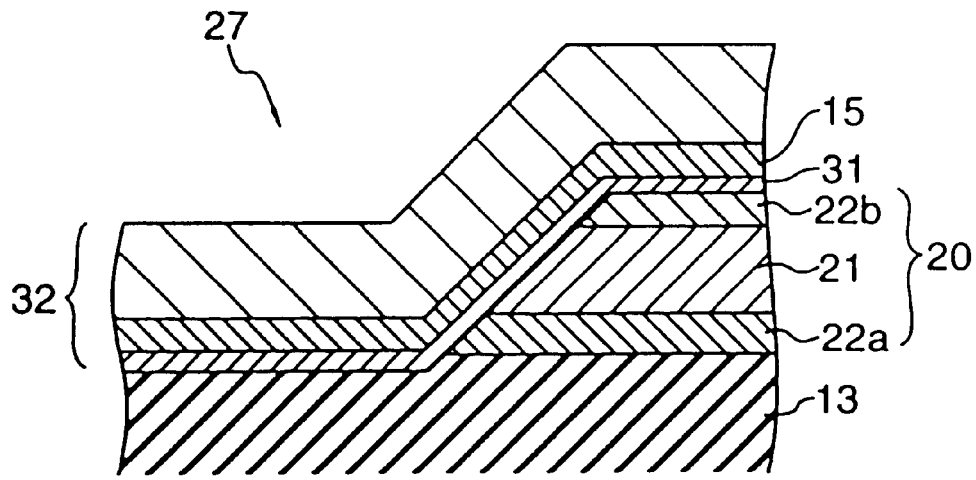
FIG. 15 is a sectional view showing an essential portion of a first modification example of the magnetic head shown in FIG. 13.

In case that a spin valve GMR film 32 having the above described non-magnetic under layer 31 is applied, as shown in FIG. 15, it is preferable to apply the hard magnetic biasing films 20 stacked in turn a first high Ms magnetic layer 22a as a seed layer, a magnetic hard layer 21 and a second high Ms magnetic layer 22b. In such an element structure, since, due to ferromagnetic field from an upper second high Ms magnetic layer 22b, magnetic flux penetrates from the tail portion of the spin valve GMR film 32, biasing magnetic field can be reinforced. Therefore, Barkhausen noise can be effectively suppressed from occurring.

Further, through roughening an upper plane of the hard magnetic biasing films 20, for example, an upper plane of the second high Ms magnetic layer 22b by milling or chemical dry etching, in case the film thickness of the non-magnetic under layer 31 is thin, the free layer 15 and the hard magnetic biasing films 20 can be exchange coupled. Thus, roughening of the upper plane of the hard magnetic biasing films 20 (formation of surface ruggedness) also can be effective when a spin valve GMR film 32 having a non-magnetic under layer 31 is used.

Figure 16:
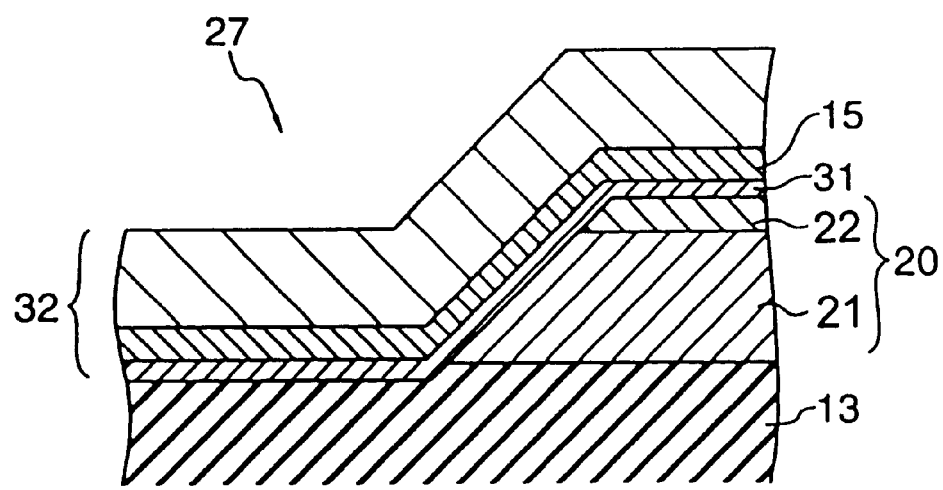
FIG. 16 is a sectional view showing an essential portion of a second modification example of the magnetic head shown in FIG. 13.

Here, as shown in FIG. 16, even in hard magnetic biasing films 20 in which a high Ms magnetic layer 22 is formed only on magnetic hard layers 21, by penetrating magnetic flux from the tail portion through ferromagnetic field as described above, thereby biasing effect can be expected. Therefore, compared with the conventional hard magnetic biasing films of a magnetic hard layer alone, Barkhausen noise can be suppressed form occurring.

Figure 17:
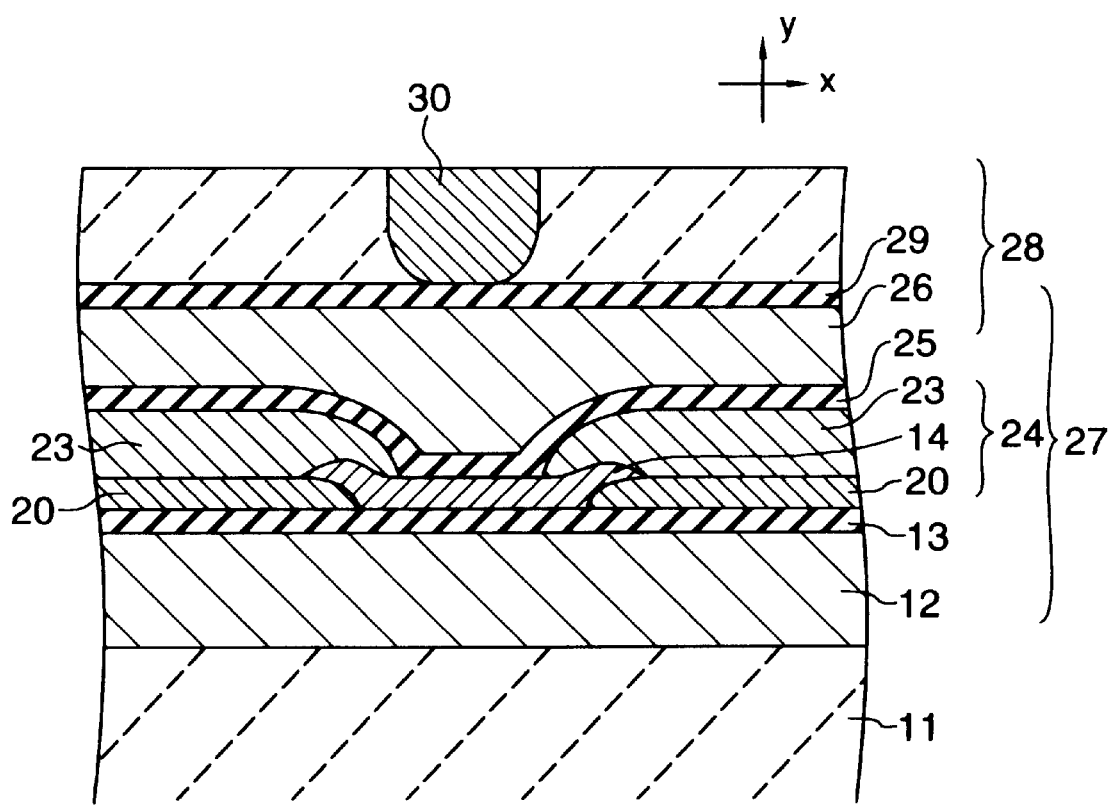
FIG. 17 is a sectional view showing another structure of a magnetic recording/read separation type head in which a magnetoresistance effect element of the present invention is applied for a read element portion.

In the above described embodiment, though a case where portions off a track width of a spin valve GMR film 14 (32) are stacked on hard magnetic biasing films 20 is described, as shown in FIG. 17, to a structure in which only both edge portions of the spin valve GMR film 14 are respectively stacked on the edge portions of the hard magnetic biasing films 20, the present invention can be applied. Here, other specific constitution or effect caused thereby are identical as those of the above described embodiment. A GMR head of an overlaid structure of the present invention can be applied to a structure in which at least both edge portions of the spin valve GMR film are stacked on the hard magnetic biasing films.

Figure 18:
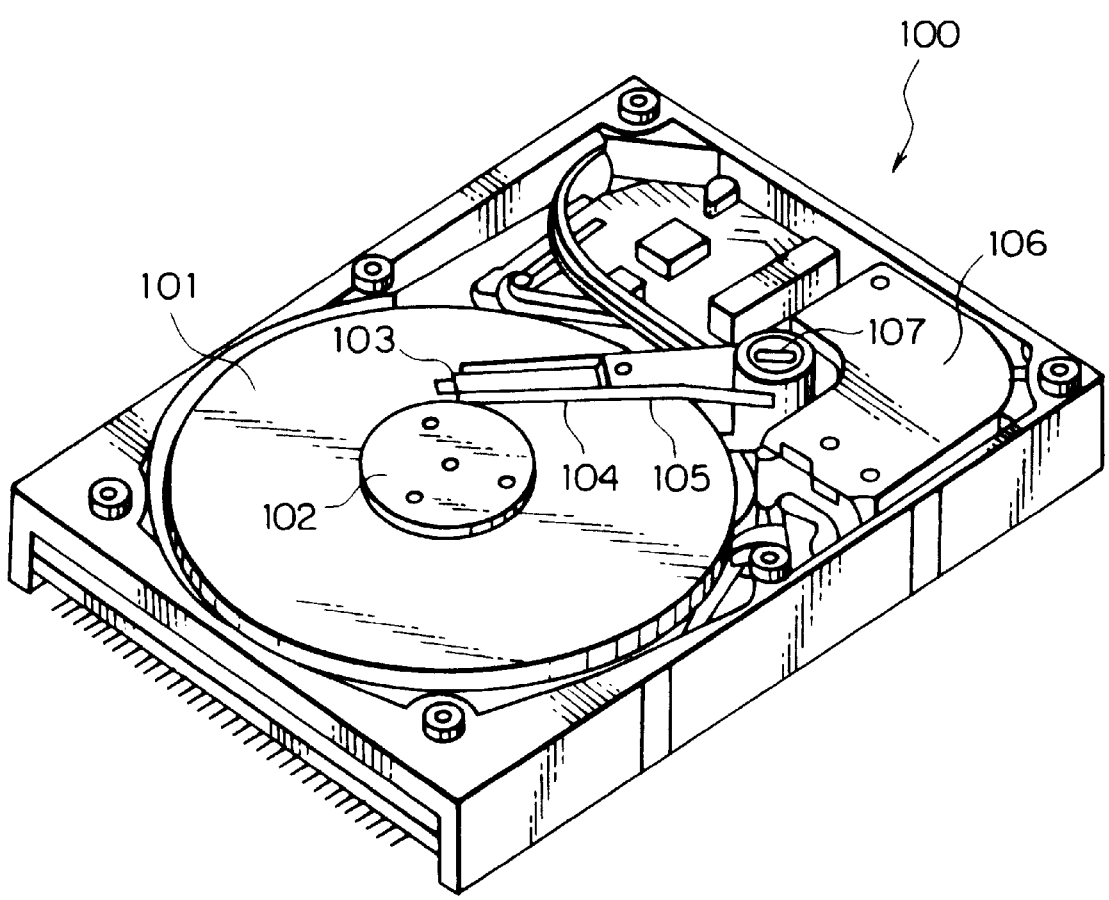
FIG. 18 is a perspective view showing one constitutional example of a magnetic disc unit in which a magnetic head of the present invention is employed.

The above described magnetic recording/read separation type head of each embodiment is assembled in a head slider. A head slider provided with a magnetic recording/read separation type head is mounted on a magnetic recording device such as a magnetic disc unit shown in, for example, FIG. 18. FIG. 18 shows a rough structure of a magnetic disc unit 100 using a rotary actuator.

A magnetic disc 101 is attached to a spindle 102 and is rotated by a motor (not shown in the figure) responding to control signal from a drive controller (not shown in the figure). A head slider 103 which records/reads information while levitating above the magnetic disc 101 is attached to a tip end of a thin-film suspension 104.

When the magnetic disc 101 rotates, an air bearing surface (ABS) of the head slider 103 is held with a predetermined levitation height (from 0 to 100 nm) from a surface of the magnetic disc 101. The head slider 103 is provided with a magnetic recording/read separation type head of the above described respective embodiment.

A suspension 104 is connected to one edge of an actuator arm 105 possessing a bobbin part for holding a not shown drive coil. At the other edge of the actuator arm 105, a voice coil motor 106, one kind of a linear motor, is disposed. The voice coil motor 106 is made up of a not shown drive coil wound up to the bobbin part of the actuator arm 105 and a magnetic circuit consisting of a permanent magnet and an opposing yoke disposed to sandwich the drive coil.

The actuator arm 105 is supported by not shown ball bearings disposed at 2 places of above and below a fixed axis 107 and can freely be rotated/slid by the voice coil motor 106.

Now, though, in the above embodiments, description was made employing a magnetic recording/read separation type head, to other head structure such as a magnetic recording/read combination type head which uses a magnetic yoke common for a recording head and a read head, a magnetoresistance effect element of the present invention can be applied.

Figure 19:
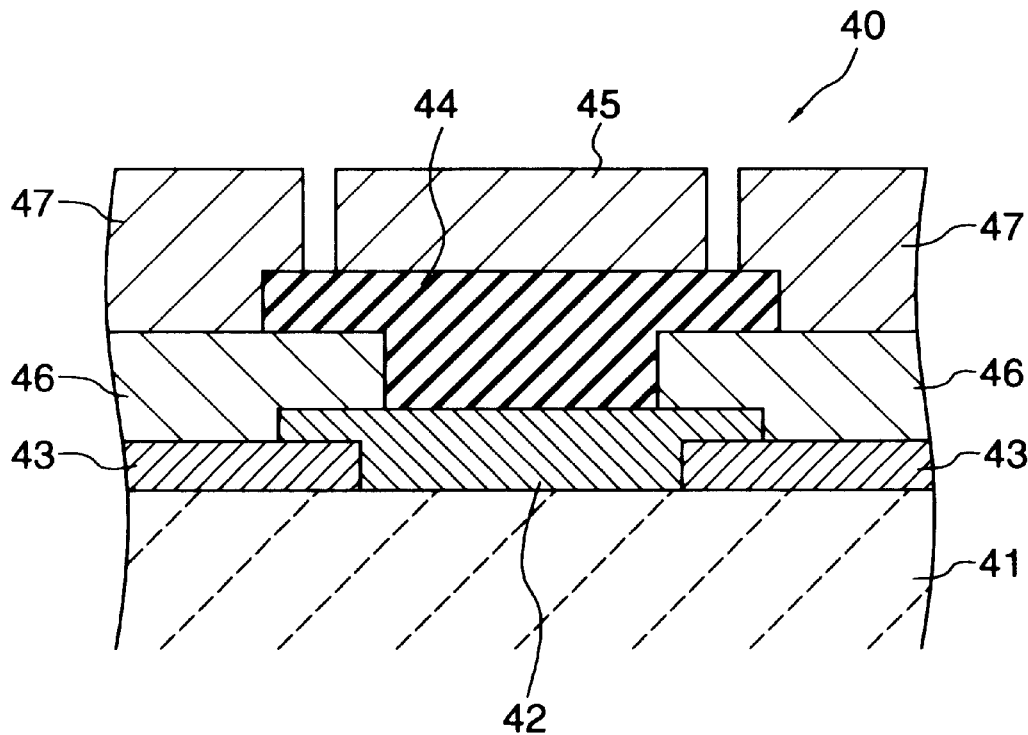
FIG. 19 is a sectional view showing one structural example of an MRAM in which a magnetoresistance effect element of the present invention is used.

The magnetoresistance effect element of the present invention, without limiting to a magnetic head, can be applied to a magnetic memory device such as a magnetoresistance effect memory (MRAM). FIG. 19 is a diagram showing the constitution of one embodiment of an MRAM utilizing giant magnetoresistance effect (GMR).

An MRAM 40 shown in FIG. 19 has a spin valve GMR film 42 formed on a substrate 41 such as glass substrate or Si substrate. The spin valve GMR film 42, as identical as the GMR head of the above described respective embodiments, is formed so as at least both edge portions thereof to be stacked on a pair of hard magnetic biasing films 43 which provides biasing magnetic field to free layers. A specific constitution of hard magnetic biasing films 43 or a laminate structure with a spin valve GMR film 42 are identical as those shown in FIG. 2, FIG. 4, FIG. 5, FIG. 13, FIG. 15, FIG. 16 and so on.

At the upper portion of a spin valve GMR film 42, a write electrode 45 is disposed through an insulation layer 44. At the both edge portions of the spin valve GMR film 42, a pair of read electrodes 46 are disposed, and, from the pair of read electrodes 46, a sense current is provided to the spin valve GMR film 42. Here, numerals 47 in the figure are auxiliary electrodes for reading.

Figure 20:
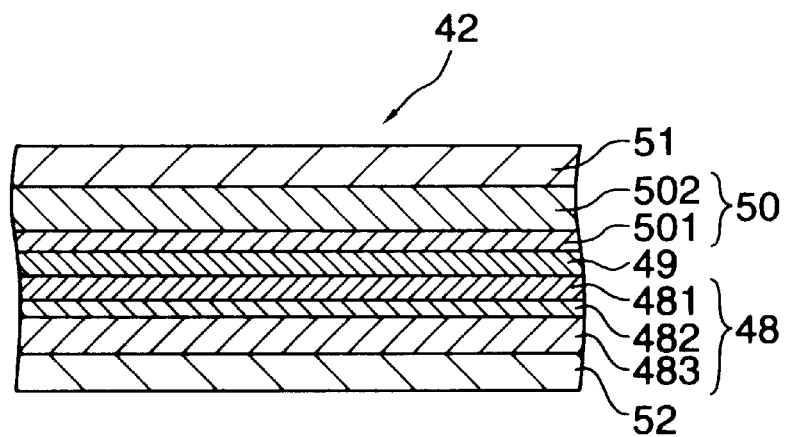
FIG. 20 is a sectional view showing in an exploded manner a magnetoresistance effect element portion of the MRAM shown in FIG. 19.
Figure 21:
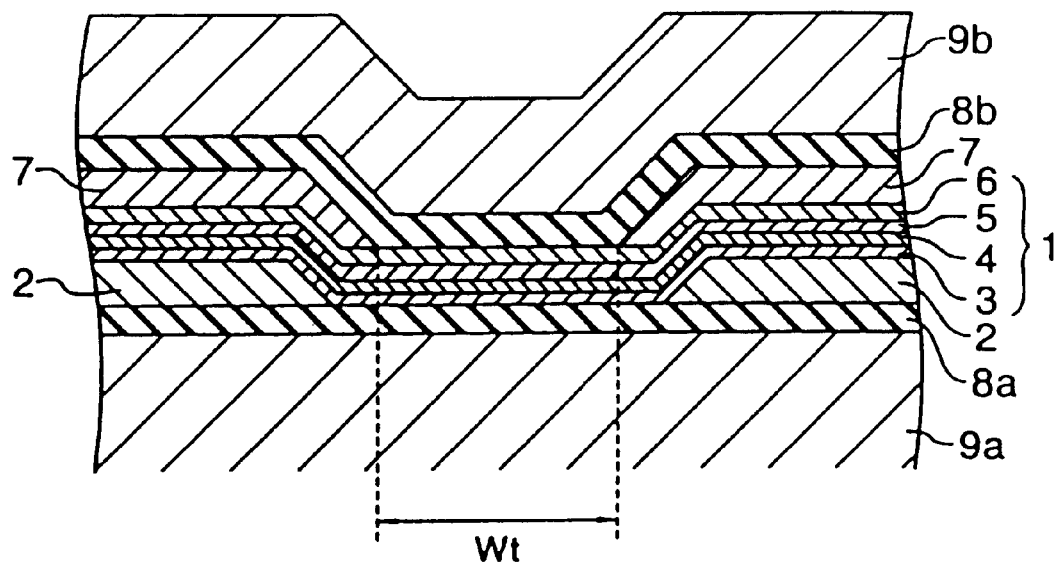
FIG. 21 is a sectional view showing one constitutional example of a magnetoresistance effect head of a conventional overlaid structure.

The above described spin valve GMR film 42, as shown in FIG. 20, has a magnetic multi-layer film stacked in turn a free layer 48 varying its magnetization direction at least according to external magnetic field, a non-magnetic layer 49 consisting of such as Cu, Au, Ag and alloys thereof and a pinned layer 50. The pinned layer 50 is made of a laminate film stacked a Co based magnetic hard layer 502 consisting of a Co containing magnetic hard material such as a CoPt alloy or a CoCrPt alloy on a non-hard magnetic layer 501 consisting of an FeCo alloy layer, for example. Since coercive force of this laminate film can be easily controlled, it can be effectively utilized as a semi-hard type information memory layer.

The free layer 48 has a Co containing ferromagnetic layer 481 such as a CoFe alloy layer, for instance, and the Co containing ferromagnetic layer 481 is disposed contacting with non-magnetic layer 49. Co containing ferromagnetic layer 481 is formed on, for example, a soft magnetic assist layer to enhance soft magnetic properties as the free layer 48. For the soft magnetic assist layer, an amorphous soft magnetic material or a crystalline soft magnetic material can be preferably used. In the present embodiment, below the Co containing ferromagnetic layer 481, a soft magnetic assist layer, a NiFe alloy layer 482 and an amorphous CoZrNb alloy layer 483 are disposed in turn. Here, numeral 51 in the figure is a protective film consisting of Ta or Ti, numeral 52 is a seed layer consisting of the identical non-magnetic material. They are formed as demands arise.

As a specific structure of the above described spin valve GMR film 42, a structure stacked Ta (5 nm) 52/amorphous CoZrNb (5 nm) 483/NiFe (2 nm) 482/CoFe (3 nm) 481/Cu (3 nm) 49/CoFe (3 nm) 501/CoPt (5 nm) 502/Ta (5 nm) 51 in turn from the substrate side can be cited.

In the pinned layer 50 consisting of a laminate film composed of a non-hard magnetic layer 501 consisting of an CoFe alloy layer and the like and a Co based magnetic hard layer 502, weak perpendicular component of Co based magnetic hard layer 502 can be shielded by non-hard magnetic layer 501 such as an CoFe alloy layer. In particular, because of disposition of non-hard magnetic layer 501 such as an CoFe alloy layer on non-magnetic layer 49 side, due to shield effect at the interface of non-magnetic layer 49 side, in-plane component of pinned layer 50 which uses Co based magnetic hard layer 502 becomes large. Thus, by increasing the in-plane component of the pinned layer 50, influence of ferromagnetic coupling between free layer 48 disposed through non-magnetic layer 49 and the pinned layer 50 can be remarkably decreased to make possible to obtain excellent magnetoresistance effect.

Recording and reading of information in the above described MRAM 40 can be executed according to the following, for example.

Recording of information is executed by providing external magnetic field by flowing electric current to recording electrode 45 to align magnetization direction of a laminate film (semi-hard layer) 50 composed of non-hard magnetic layer 501 consisting of such as an FeCo alloy layer and Co based magnetic hard layer 502 to direction corresponding to "1" or "0".

Reading of memorized information is executed by flowing pulse current of plus or minus sign to recording electrode 45 to reverse magnetization direction of free layer 48, which is soft magnetic layer, by its current magnetic field while flowing a sense current from the reading electrode 46. To plus or minus sign of recording electrode 45, magnetization direction of free layer 48 is constant in spite of "1", "0" of the semi-hard layer 50.

Besides, according to magnetization direction of semi-hard layer 50 memorized as "1" or "0", whether, when pulse electric current of recording electrode 45 is plus, magnetization directions of the upper and lower ferromagnetic layers (48,50) of the spin valve GMR film 42 are parallel or, when minus, anti-parallel, or, when pulse electric current of recording electrode 45 is minus, magnetization directions are parallel, or when plus, anti-parallel, is decided. Therefore, when pulse electric current of plus→minus, for example, is flowed to the recording electrode, depending on whether resistance of the sense current is large→small or small→large, "1" or "0" of the semi-hard layer 50 is judged.

Hard magnetic biasing films 43 in an MRAM 40 is to control magnetic field where magnetic reversal of free layer 48 occurs when pulse current of plus or minus is flowed to the recording electrode 45 or to suppress noise accompanying irregular magnetic reversal in a state where magnetic domain is formed. Here, concerning hard magnetic biasing film, it is important to obtain bias strength enough to suppress increase of demagnetization field due to thinner film and fine cell size corresponding to high integration. As described in detail in the above described embodiment of the magnetic head, according to hard magnetic biasing films 43 consisting of a laminate film composed of a high Ms magnetic layer and a magnetic hard layer, since sufficient bias strength can be obtained, further high integration of MRAM 40 can be materialized.

Further, in the above described MRAM 40, since a laminate film (semi-hard layer) 50 composed of a non-hard magnetic layer 501 consisting of such as an FeCo alloy layer and a Co based magnetic hard layer 502 has a high squareness ratio and, therefore, is excellent in its characteristic as a memory layer, according to the state of either "1" or "0", nearly complete recording of inverse direction can be executed.

In an MRAM employing a conventional magnetic hard layer as a memory layer, since influence of ferromagnetic coupling of a spin valve GMR film is large, when a pulse current of plus or minus sign is flowed to the recording electrode 45, that adversely affects on shift of the magnetization direction of the free layer 48, resulting in difficulty of materializing the complete one-direction magnetization. Since the spin valve GMR film 42 is remarkably reduced in its influence of the ferromagnetic coupling, the complete one-direction magnetization can be materialized. In addition, in an MRAM using a conventional magnetic hard layer as its memory layer, increase of thickness of a non-magnetic layer to eliminate the influence of the ferromagnetic coupling make low its MR change rate, resulting in lowering of S/N.

As described in the above, according to a magnetoresistance effect element of the present invention, since it employs laminate film composed of a high saturation magnetization magnetic layer and a magnetic hard layer as hard magnetic biasing films, even when a free layer of high saturation magnetization is applied for an overlaid structure, further even when a track width, in particular, is narrowed, Barkhausen noise can be effectively prevented from occurring.

What is claimed is:

1. A magnetoresistance effect element, comprising:
   a pair of magnetic biasing films each having a laminate film comprising a magnetic hard layer and a high saturation magnetization magnetic layer;
   a magnetoresistance effect film having a free layer varying its magnetization direction according to an external magnetic field, a non-magnetic layer stacked on the free layer thereabove, and a pinned layer stacked on the non-magnetic layer thereabove, wherein, the magnetoresistance effect film has passive end regions separated by a central active region and the passive end regions are stacked on the pair of magnetic biasing films; and
   a pair of electrodes providing a sense current to the magnetoresistance effect film;
   wherein, when the saturation magnetization of the high magnetization magnetic layer is $Ms^{high}$, the saturation magnetization of the free layer is $Ms^{free}$, and the saturation magnetization of the hard magnetic layer is $Ms^{hard}$, the saturation magnetization $Ms^{high}$ of the high magnetization magnetic layer satisfies at least one of the following relations of $Ms^{high} \geq Ms^{free}$ and $Ms^{high} \geq Ms^{hard}$.

2. The magnetoresistance effect element as set forth in claim 1:
   wherein, the magnetic hard layer is stacked on the high saturation magnetization magnetic layer.

3. The magnetoresistance effect element as set forth in claim 1:
   wherein, the high saturation magnetization magnetic layer has a first layer and a second layer, the second layer being stacked on the first layer through the magnetic hard layer.

4. The magnetoresistance effect element as set forth in claim 1:
   wherein, the saturation magnetization of the high saturation magnetization magnetic layer is 1000 emu/cc or more.

5. The magnetoresistance effect element as set forth in claim 1:
   wherein, the remanent magnetization of the magnetic biasing film is 600 emu/cc or more.

6. The magnetoresistance effect element as set forth in claim 1:
   wherein, the free layer has a Co containing magnetic layer.

7. The magnetoresistance effect element as set forth in claim 1:
   wherein, the high saturation magnetization magnetic layer comprises an FeCo alloy.

8. The magnetoresistance effect element as set forth in claim 7:
   wherein, the FeCo alloy contains Co in the range of 5 to 40 at %.

9. The magnetoresistance effect element as set forth in claim 1:
   wherein, the magnetic hard layer comprises a Co based magnetic hard alloy.

10. The magnetoresistance effect element as set forth in claim 9:
    wherein, the Co based magnetic hard alloy is a CoPt alloy.

11. The magnetoresistance effect element as set forth in claim 9:
    wherein, the high saturation magnetization magnetic layer has a film thickness in the range of 3 to 20 nm and the magnetic hard layer has a film thickness of 100 nm or less.

12. The magnetoresistance effect element as set forth in claim 1:
    wherein, the pair of electrodes are stacked on the magnetoresistance effect film so as to provide a track width of the magnetoresistance effect film.

13. The magnetoresistance effect element as set forth in claim 1:
    wherein, the free layer and the magnetic biasing film are in ferromagnetic exchange coupling.

14. The magnetoresistance effect element as set forth in claim 1:
    wherein, the free layer and the magnetic biasing film are stacked with a non-magnetic layer therebetween.

15. The magnetoresistance effect element as set forth in claim 1:
    wherein, the passive end regions of the magnetoresistance effect film are laid over the pair of magnetic biasing films and the pair of electrodes are disposed over the passive end regions of the magnetoresistance effect film.

16. A magnetic head, comprising:

a lower magnetic shield;

a magnetoresistance effect element formed on the lower magnetic shield through a lower read magnetic gap, the magnetoresistance effect element comprising:

a pair of magnetic biasing films each having a laminate film comprising a magnetic hard layer and a high saturation magnetization magnetic layer;

a magnetoresistance effect film having a free layer varying its magnetization direction according to an external magnetic field, a non-magnetic layer stacked on the free layer, and a pinned layer stacked on the non-magnetic layer, wherein the magnetoresistance effect film has passive end regions separated by a central active region and the passive end regions are stacked on the pair of magnetic biasing films; and a pair of electrodes providing a sense current to the magnetoresistance effect film, wherein the saturation magnetization $Ms^{high}$ of the high magnetization magnetic layer, the saturation magnetization $Ms^{free}$ of the free layer, and the saturation magnetization $Ms^{hard}$ of the hard magnetic layer satisfy at least one of the following relations of $Ms^{high} \geq Ms^{free}$ and $Ms^{high} \geq Ms^{hard}$; and an upper magnetic shield formed on the magnetoresistance effect element through an upper read magnetic gap.

17. The magnetic head as set forth in claim 16, further comprising:

a lower magnetic pole and the upper magnetic shield being one body;

a recording magnetic gap formed on the lower magnetic pole; and an upper magnetic pole disposed on the recording magnetic gap.

18. A magnetic recording device, comprising:

a magnetic recording medium; and a head slider provided with a magnetoresistance effect element, the magnetoresistance effect element reading a signal magnetic field from the magnetic recording medium and comprising:

a pair of magnetic biasing films which have a laminate film comprising a magnetic hard layer and a high saturation magnetization magnetic layer;

a magnetoresistance effect film having a free layer varying its magnetization direction according to an external magnetic field, a non-magnetic layer stacked on the free layer, and a pinned layer stacked on the non-magnetic layer, wherein the magnetoresistance effect film has passive end regions separated by a central active region and the passive end regions are stacked on the pair of magnetic biasing films; and a pair of electrodes providing a sense current to the magnetoresistance effect film, wherein the saturation magnetization $Ms^{high}$ of the high magnetization magnetic layer, the saturation magnetization $Ms^{free}$ of the free layer, and the saturation magnetization $Ms^{hard}$ of the hard magnetic layer satisfy at least one of the following relations of $Ms^{high} \geq Ms^{free}$ and $Ms^{high} 24\ Ms^{hard}$.

* * * * *

UNITED STATES PATENT AND TRADEMARK OFFICE
CERTIFICATE OF CORRECTION

PATENT NO.: 6,111,722

DATED: August 29, 2000

INVENTOR(S): Fukuzawa et al.

It is certified that an error appears in the above-identified patent and that said Letters Patent is hereby corrected as shown below:

Claim 18, column 20, line 32, change "$Ms^{high} 24\ Ms^{hard}$" to --$Ms^{high} \geq Ms^{hard}$--.

Signed and Sealed this

First Day of May, 2001

Attest:

NICHOLAS P. GODICI

Attesting Officer     Acting Director of the United States Patent and Trademark Office